(12) United States Patent
Hsu et al.

(10) Patent No.: US 9,620,461 B2
(45) Date of Patent: Apr. 11, 2017

(54) LAMINAR STRUCTURE OF SEMICONDUCTOR AND MANUFACTURING METHOD THEREOF

(71) Applicant: GlobalWafers Co., Ltd., Hsinchu (TW)

(72) Inventors: Wen-Ching Hsu, Hsinchu (TW); Chia-Wen Ko, Hsinchu (TW); Chiou-Mei Luo, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 14/734,779

(22) Filed: Jun. 9, 2015

(65) Prior Publication Data

US 2015/0357290 A1    Dec. 10, 2015

Related U.S. Application Data

(60) Provisional application No. 62/009,741, filed on Jun. 9, 2014.

(51) Int. Cl.
*H01L 23/00* (2006.01)
*H01L 29/20* (2006.01)
(Continued)

(52) U.S. Cl.
CPC ...... *H01L 23/562* (2013.01); *H01L 21/76841* (2013.01); *H01L 23/53209* (2013.01);
(Continued)

(58) Field of Classification Search
CPC ........... H01L 21/0254; H01L 21/02381; H01L 21/02433; H01L 21/02016; H01L 23/562; H01L 21/02455; H01L 21/02365
See application file for complete search history.

(56) References Cited

U.S. PATENT DOCUMENTS 4,830,984 A * 5/1989 Purdes ............. H01L 21/02381
117/106
6,031,252 A * 2/2000 Miura ............... H01L 21/02392
257/190
(Continued)

FOREIGN PATENT DOCUMENTS

| CN | 101901752 A | 12/2010 |
| CN | 102479683 A | 5/2012 |
| TW | 201133938 A | 10/2011 |

OTHER PUBLICATIONS

W.H. Strehlow and E.L. Cook, "Compilation of Energy Band Gaps in Elemental and Binary Compound Semiconductors and Insulators" J .Phys. Chem. Ref. Data, vol. 2, No. 1, 1973.*

*Primary Examiner* — Dale E Page
*Assistant Examiner* — John Bodnar
(74) *Attorney, Agent, or Firm* — Osha Liang LLP

(57) ABSTRACT

A laminar structure of semiconductors comprises a silicon substrate, an epitaxial layer, a protective layer, a first layer and a second layer. The epitaxial layer is arranged above the silicon substrate and the protective layer is arranged below the silicon substrate. Thermal expansion coefficients of the epitaxial layer and the protective layer are both either greater than or less than that of the silicon substrate. The first layer is arranged between the silicon substrate and the protective layer; and the second layer is arranged between the silicon substrate and the epitaxial layer, wherein the band gap of the first layer and the second layer are both greater than 3 eV. By arranging the protective layer below the silicon substrate, stress generated between the silicon substrate and the epitaxial layer can be reduced to prevent occurrence of bending or crack. Therefore, yield can be promoted and costs can be reduced.

12 Claims, 6 Drawing Sheets

(51) Int. Cl.
*H01L 23/532* (2006.01)
*H01L 21/02* (2006.01)
*H01L 21/768* (2006.01)
*H01L 29/205* (2006.01)

(52) U.S. Cl.
CPC .... H01L 23/53271 (2013.01); H01L 29/2003 (2013.01); H01L 29/205 (2013.01); *H01L 21/0254* (2013.01); *H01L 21/02381* (2013.01); *H01L 21/02433* (2013.01); *H01L 21/02458* (2013.01); *H01L 21/02488* (2013.01); *H01L 2924/0002* (2013.01)

(56) References Cited

U.S. PATENT DOCUMENTS

2003/0033974 A1* 2/2003 Ueda .............. C30B 25/18
  117/84
2012/0132921 A1* 5/2012 Chen .............. H01L 21/02365
  257/76
2015/0035123 A1* 2/2015 Bayram ............ H01L 21/0243
  257/615

* cited by examiner

LAMINAR STRUCTURE OF SEMICONDUCTOR AND MANUFACTURING METHOD THEREOF

BACKGROUND OF THE INVENTION

1. Field of the Invention

The present invention relates to a laminar structure of semiconductor, in particular to a laminar structure of semiconductor that is applied to a semiconductor component.

2. Description of the Prior Art

Among semiconductor materials, gallium nitride (GaN) is provided with good electrical conductivity, thermal conductivity and thermal stability, and thus can be used as high-power components. In addition, due to the wide band-gap, GaN is capable of emitting at the green to violet wavelength and is also suitable as a full-color light-emitting element. However, the substrate, such as silicon substrate, for epitaxial growth of GaN has huge differences in lattice constant and thermal expansion coefficient from GaN, namely 17% and 46%, respectively; therefore, there exists considerable stress field between these two. Bending or crack due to excessive tensile stress may occur during the cooling process after completion of GaN epitaxial film growth and result in reduced component yield. Adopting a sapphire ($Al_2O_3$) substrate may have the same problem (16% lattice mismatch and 34% differences in thermal expansion coefficient) with higher cost. In addition, silicon carbide (SiC) can also be used as the substrate (3.5% lattice mismatch, and 25% differences in thermal expansion coefficient). However, the cost of SiC is too high for commercial development.

Furthermore, a buffer layer may be arranged between the substrate and the epitaxial layer to reduce the lattice mismatch and further stress. However, the buffer layer must be provided with good lattice structure in order to grow the epitaxial layer with good quality; therefore, it still needs high-temperature crystal growth process, which is complicated and expensive.

Regarding a laminar structure of semiconductor for reducing the stress, referring to FIG. 6, CN Patent Publication No. CN101901752A disclosed a laminated semiconductor structure 1, substrate 2, a first film 3, a buffer layer 4, the second film 5, wherein the thermal expansion coefficient of the first film is lower than that of the substrate 2, and the thermal expansion coefficient of the second film 5 is higher than that of the substrate, so that the substrate 2 and all the films (3,4,5) remain hardly warped state at room temperature.

TW Patent Publication No. TW201133938 discloses a semiconductor light emitting device with curvature control layer made of a polycrystalline α-$Al_2O_3$ and deposited on the substrate by electron beam ion or sputtering deposition. The curvature control layer has a greater thermal expansion coefficient than GaN epitaxial layer. CN Patent Publication No. CN102479683 disclose a GaN layer and a silicon nitride material (high CTE layer) and the thermal expansion coefficients of the GaN layer and the silicon nitride material is greater than that of the silicon substrate so as to solve wafer bending/deformation/defect caused by differences in coefficient of expansion and achieve flat effect for wafer. However, better compatibility between the epitaxial layer and the substrate is still a goal to be achieved.

It is now a goal to develop a laminar structure of semiconductor, which can reduce the effect of stress between the epitaxial layer and the substrate to avoid bending or crack caused by stress to further achieve enhanced yield. In addition, if the manufacturing process may be simplified, the cost may be saved and the application fields may be broadened.

SUMMARY OF THE INVENTION

The present invention is directed to providing a laminar structure of semiconductor provided with a protective layer on the rear side of the substrate so as to reduce the stress effect between the epitaxial layer and the substrate to avoid bending and crack phenomenon, and further achieve improved yield and saved cost.

According to one embodiment of the present invention, a laminar structure of semiconductor includes a silicon substrate, an epitaxial layer, a protective layer, a first layer and a second layer. The epitaxial layer is arranged above the silicon substrate. The protective layer is arranged below the silicon substrate, wherein the thermal expansion coefficients of the epitaxial layer and the protective layer are both either greater than or less than that of the silicon substrate and the protective layer is made of a metal silicide or a polysilicon. The first layer is arranged on a lower surface of the substrate and the protective layer is set on the first layer, wherein a band gap of the first layer is greater than 3 eV; and the second layer is arranged on an upper surface of the silicon substrate and the epitaxial layer is set on the second layer, wherein a band gap of the second layer is greater than 3 eV; the silicon substrate is partially enclosed by the first layer and the second layer; and the first layer and the second layer both are a nitride layer; the upper surface, a side wall, and a portion of the lower surface of the silicon substrate is covered by the nitride layer; and the side wall of the silicon substrate is covered by the first layer and the second layer; and the second layer extends along the lower surface from the side wall towards the inner portion of the silicon substrate.

According to another embodiment of the present invention, a method for manufacturing a laminar structure of semiconductor, including providing a substrate, wherein the substrate is a silicon substrate; forming a first layer below the substrate before forming the protective layer, wherein the band gap of the first layer is greater than 3 eV; forming a second layer above the substrate before forming the epitaxial layer, wherein the band gap of the second layer is greater than 3 eV; forming a protective layer below the first layer, wherein coefficients of thermal expansion of the epitaxial layer and the protective layer are simultaneously greater than or less than that of the substrate, and the protective layer is made of a metal silicide or a polysilicon; and forming an epitaxial layer above the second layer.

Other advantages of the present invention will become apparent from the following descriptions taken in conjunction with the accompanying drawings wherein certain embodiments of the present invention are set forth by way of illustration and examples.

BRIEF DESCRIPTION OF THE DRAWINGS

The foregoing aspects and many of the accompanying advantages of this invention will become more readily appreciated as the same becomes better understood by reference to the following detailed descriptions, when taken in conjunction with the accompanying drawings, wherein.

DESCRIPTION OF THE PREFERRED EMBODIMENT

Figure 1:
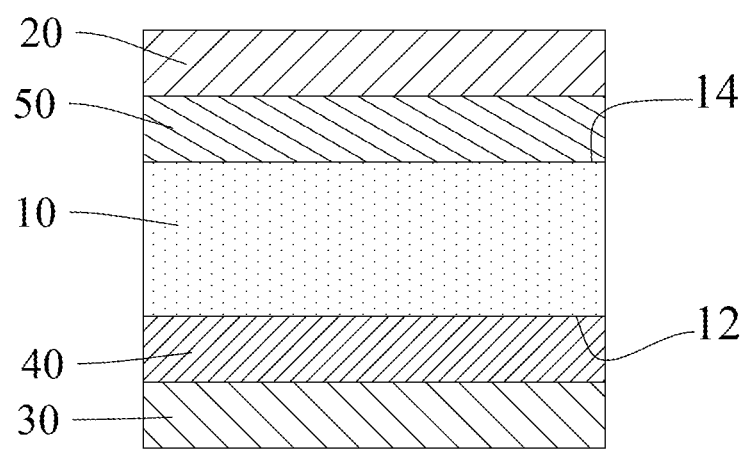
FIG. 1 is a schematic diagram illustrating a laminar structure of semiconductor according to one embodiment of the present invention.

Refer to FIG. 1, which is a schematic diagram illustrating a laminar structure of semiconductor according to one embodiment of the present invention. The laminar structure of semiconductor includes a substrate 10, an epitaxial layer 20, a protective layer 30, a first layer 40 and a second layer 50. The epitaxial layer 20 is arranged above the substrate 10. The protective layer 30 is arranged below the substrate 10, wherein the thermal expansion coefficients of the epitaxial layer 20 and the protective layer 30 are simultaneously greater than or less than that of the substrate 10. The first layer 40 is arranged on a lower surface 12 of the substrate 10 and between the substrate 10 and the protective layer 30, wherein a band gap of the first layer 40 is greater than 3 eV; and/or the second layer 50 is arranged on an upper surface 14 of the substrate 10 and between the substrate 10 and the epitaxial layer 20, wherein a band gap of the second layer 50 is greater than 3 eV. Further, in the embodiment, the first layer 40 and the second layer 50 are both formed as shown in FIG. 1.

In one embodiment, the substrate 10 is a silicon substrate, a silicon carbide (SiC) substrate or a lithium aluminate (LiAlO$_2$) substrate. In the case of a silicon substrate as the substrate 10, the silicon substrate may be a {100} crystal orientation silicon substrate or a {111} crystal orientation silicon substrate. The crystal orientation of the silicon substrate can cause impacts to the orientation of epitaxial growth. The epitaxial layer 20 growing on the substrate 10 is typically made of III-V compounds, which have wide band gaps, high electron mobility and high physical strength properties, and therefore can be applied to light-emitting elements, high-power components or high-frequency components. For example, the epitaxial layer 20 may be a gallium nitride (GaN) epitaxial layer or an aluminum nitride (AlN) epitaxial layer.

The protective layer 30, which is a stress adjustment layer, is mainly formed by glassy amorphous and viscoelastic materials such as polysilicon, metal silicides, silicon dioxide or silicon nitride. Preferably, the metal silicides may be transition metal silicides, such as NiSi, Ni$_2$Si, NiSi$_2$, tungsten silicide, titanium silicide, tantalum silicide, molybdenum silicide and so on. Since polysilicon or metal silicide materials have good thermal mechanical effects, resulting better protection may be thus obtained.

Due to the difference in lattice constant and thermal expansion coefficients between the substrate 10 and the epitaxial layer 20, stress field would be generated and cause bending or crack. When the epitaxial layer 20 is made of GaN, the differences in lattice constant and the thermal expansion coefficient from that of the substrate 10 of different types are silicon substrate (17%, 46%), the sapphire substrate (16%, 34%) and SiC substrates (3.5%, 25%), respectively. One property of the viscoelastic material used in the present invention includes decreased stress with time when the stress is fixed, such that the stress field caused by the lattice mismatch may be adjusted. For example, when the GaN grows on silicon substrate, due to the smaller constant of GaN lattice than that of silicon, the silicon substrate would be pressed by stress, GaN would be affected by the tensile stress, and the protective layer 30 set in advance below the substrate 10 can firstly reduce the effects of stress field. Then, when the growth of the GaN epitaxial layer is completed, the GaN epitaxial layer cools down in conjunction with the silicon substrate. Due to the large thermal expansion coefficient, GaN subjects to greater tensile stress (cold shrink) when cooled, and silicon substrate is subject to greater pressure stress to result in bending and crack phenomenon. However, with stress adjustment and protection by the protective layer 30, stress can be absorbed and released gradually.

In this embodiment, the thermal expansion coefficients of the epitaxial layer 20 and protective layer 30 have to be simultaneously greater than that of the substrate 10 so as to achieve the effect of stress adjustment. Although the silicon substrate is at lower cost, the lattice mismatch and the high thermal expansion coefficient differences between GaN and the silicon substrate are so large that the device yield is impacted. The utilization of laminar structure of semiconductor of the present invention can reduce costs and increase yields. In addition, if thermal expansion coefficient of the epitaxial layer 20 is less than the substrate 10, e.g. a sapphire substrate, the thermal expansion coefficients of the epitaxial layer 20 and the protective layer 30 must be less than that of the substrate 10.

Further, since the viscoelastic material constituting the protective layer 30 has a glassy amorphous structure and is different from a buffer layer having conventional crystal structure. Therefore, the protective layer 30 may be obtained from a low-temperature process, which is simpler and costs less since it is not necessary to undergo high temperature environment for crystal growing and adjust complicated crystal growing parameter. Further, since the protective layer 30 is an amorphous structure, the protective layer 30 would not cause lattice mismatch issue between the substrate 10 and is applicable to various substrates. Therefore, the choices for the substrate would be wider and so is the application level.

For example, the first layer 40 and/or the second layer 50 can be but not limited to a nitride layer. Further, the first layer 40 and/or the second layer 50 may be a silicon nitride (Si$_3$N$_4$) layer, a gallium nitride (GaN) layer or an aluminum gallium nitride (AlGaN) layer, having a thickness of about 20 nm to 100 nm. This first layer 40 is also used to reduce the effect of stress caused by the effect of the epitaxial layer 20. For example, the first layer 40 and/or the second layer 50 may cause warping of the substrate 10 in advance, and then eliminate the stress caused by the epitaxial layer 20 in conjunction with the protective layer 30.

Figure 2:
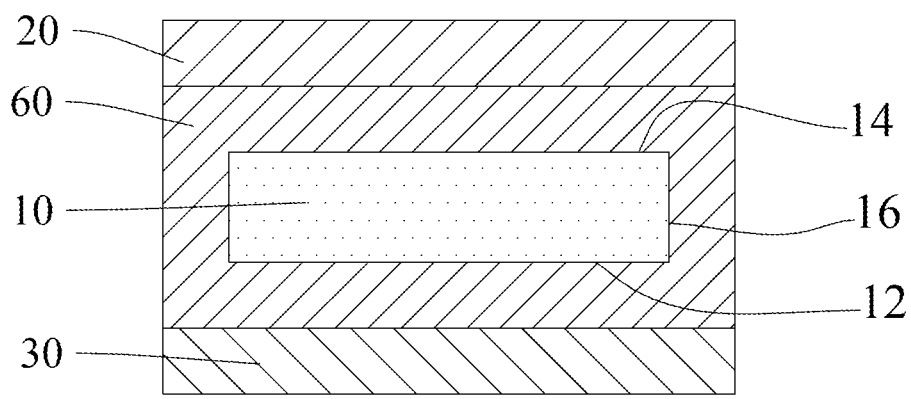
FIG. 2 is a schematic diagram illustrating a laminar structure of semiconductor according to another embodiment of the present invention.
Figure 3:
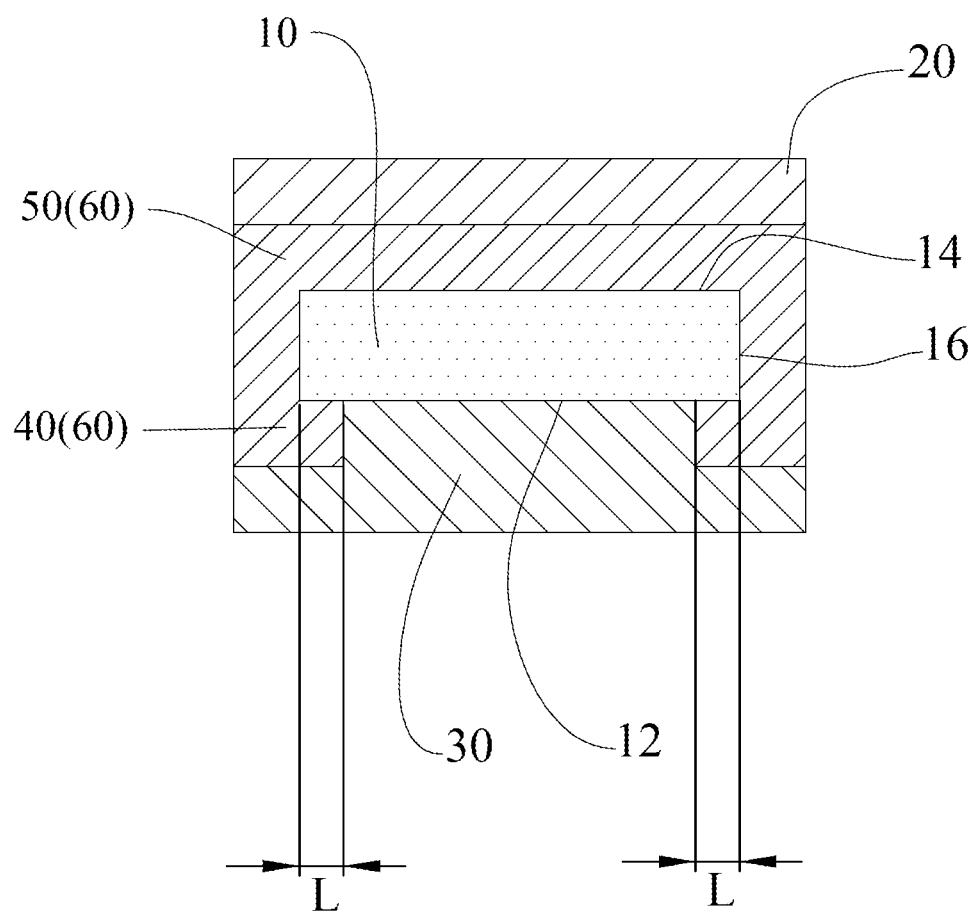
FIG. 3 is a schematic diagram illustrating a laminar structure of semiconductor according to another embodiment of the present invention.

Referring to FIG. 2, in one embodiment, the substrate 10 is enclosed by the first layer 40 and the second layer 50; and the first layer 40 and the second layer 50 both are a nitride layer, such as numeral 60 in FIG. 2. The nitride layer 60 enclosing the substrate 10 may be arranged between the epitaxial layer 20 and the protective layer 30. In this way, the substrate 10 may fully enclosed by the nitride layer 60 such that the silicon substrate 10 would not react with the epitaxial layer 20 so as to prevent meltback and reclaim the substrate. In another embodiment, such as shown in FIG. 3, the substrate 10 may be partially enclosed by the first layer 40 and the second layer 50; and the first layer 40 and the second layer 50 both are a nitride layer. In one embodiment, the upper surface 14, a side wall 16, and a portion of the lower surface 12 of the substrate 10 is covered by the nitride layer 60. Especially, the side wall 16 of the substrate 10 is covered by the first layer 40 and the second layer 50; and the second layer 50 is formed to extend along the lower surface 12 from the side wall 16 towards the inner portion of the substrate 10. In one embodiment, the extending length L of the second layer 50 is about 1 centimeter. The same as the above-mentioned embodiment, the upper surface 14 of the substrate 10 may fully enclosed by the nitride layer 60 such that the silicon substrate 10 would not react with the epitaxial layer 20 so as to prevent meltback and reclaim the substrate.

The thickness of the laminar structure of semiconductor of the present invention is not particularly limited. In one embodiment, the thickness of the substrate 10 ranges from 400 μm to 1500 μm; thickness of the epitaxial layer 20 ranges from 0.5 μm to 10 μm; and thickness of the protective layer 30 ranges from 0.5 μm to 10 μm.

Figure 4:
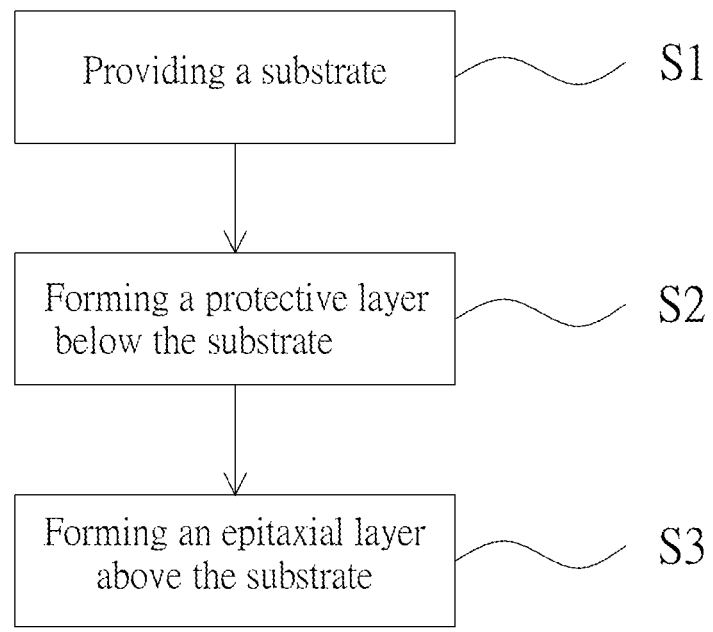
FIG. 4 is a flow chart illustrating a manufacturing process of a laminar structure of semiconductor according to one embodiment of the present invention.
Figure 5:
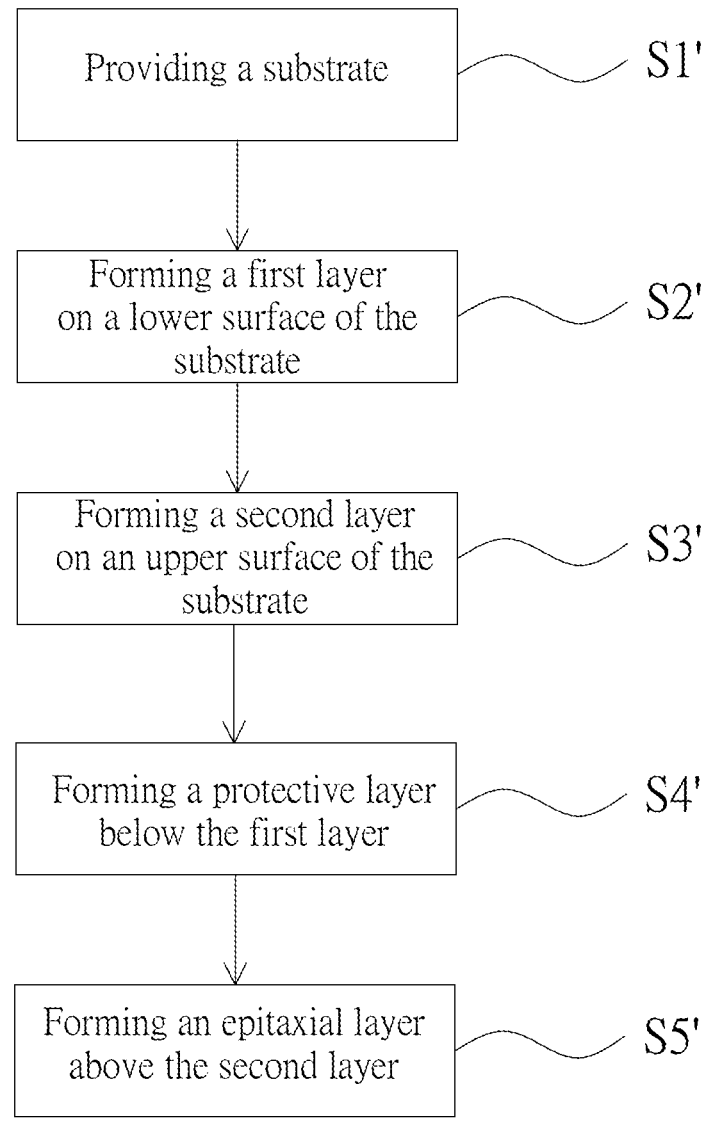
FIG. 5 is a flow chart illustrating a manufacturing process of a laminar structure of semiconductor according to another embodiment of the present invention.
Figure 6:
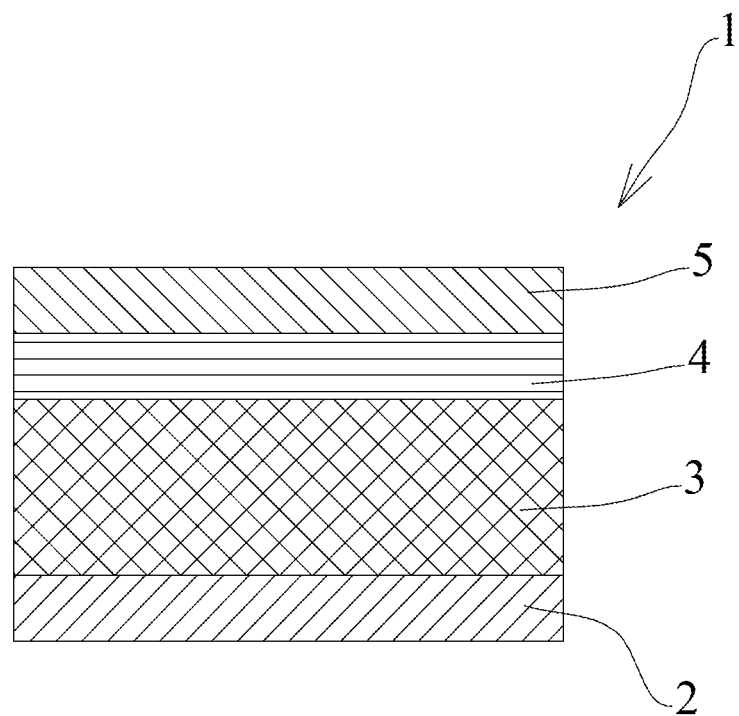
FIG. 6 is a schematic diagram illustrating a laminar structure of semiconductor of prior art.

Also, referring back to FIGS. 1 and 4, a method of manufacturing a semiconductor layered structure is also provided herein, comprising: providing a substrate 10 (step S1), and a protective layer 30 is formed below the substrate 10 (step S2), where the protective layer is formed at a temperature ranging from 400° C. to 900° C., and the protective layer 30 has viscoelastic properties. Finally, an epitaxial layer 20 is formed above the substrate 10 (step S3), wherein the thermal expansion coefficients of the epitaxial layer 20 and the protective layer 30 is simultaneously greater than or less than that of the substrate 10. In one embodiment, referring to FIG. 1 and FIG. 5, the manufacturing method of the laminar structure of semiconductor further comprises forming a first layer 40 on a lower surface 12 of the substrate 10 and between the substrate 10 and the protective layer 30 and forming a second layer 50 on an upper surface 14 of the substrate 10 and between the substrate 10 and the epitaxial layer 20, wherein a band gap of the first layer 40 and the second layer 50 are both greater than 3 eV. The steps are listed as follows: providing a substrate 10 (step Si'), and forming a first layer 40 on a lower surface of the substrate 10 (step S2'). Next, a second layer 50 is formed on an upper surface of the substrate 10 (step S3'). A protective layer 30 is formed below (step S4') the first layer 40, wherein the protective layer 30 is formed at a temperature ranging from 400° C. to 900° C., and the protective layer 30 has viscoelastic properties. Finally an epitaxial layer 20 is formed above the second layer 50 (step S5'), wherein the coefficients of thermal expansion of the epitaxial layer 20 and the protective layer 30 are simultaneously greater than or less than that of the substrate 10. The rest regarding the nature and relevant principles of the laminar structure of semiconductor have described above and hence abbreviated.

Here, the protective layer 30 grows into a more loose structure at a lower temperature in advance and becomes denser structure during the subsequent high temperature for growing the epitaxial layer 20 so as to offset stress generated during epitaxial layer growth to avoid bending or crack of the substrate. In one embodiment, the substrate 10 may be a silicon substrate, a silicon carbide substrate or a lithium aluminate substrate. For example, the substrate 10 may be a {100} crystal orientation silicon substrate or a {111} crystal orientation silicon substrate. The epitaxial layer 20 may be a gallium nitride epitaxial layer or an aluminum nitride epitaxial layer. The protective layer 30 may be a polysilicon layer or a metal silicide layer.

In still another embodiment, referring to FIG. 2, the manufacturing method of the laminar structure of semiconductor, wherein the substrate 10 is enclosed by the first layer 40 and the second layer 50 before forming the protective layer 30 and the epitaxial layer 20; and the first layer 40 and the second layer 50 both are a nitride layer 60. In still another embodiment, referring to FIG. 3, the manufacturing method of the laminar structure of semiconductor, wherein the substrate 10 is partially enclosed by the first layer 40 and the second layer 50 before forming the protective layer 30 and the epitaxial layer 20; and the first layer 40 and the second layer 50 both are a nitride layer, such as numeral 60 in the FIG. 3. The procedures are similar to those above-mentioned embodiments, and hence abbreviated. In the best embodiment, the nitride layer 60 is formed by an atomic layer deposition method (ALD).

In addition, a method for forming the protective layer 30, the epitaxial layer 20, the first layer 40, second layer 50 and nitride layer 60 may include a chemical vapor deposition method (CVD), electrochemical deposition method, gas-liquid solid deposition, vapor transport deposition, sol-gel method, atomic layer deposition (ALD) or plasma enhanced atomic layer deposition (plasma-enhanced ALD). Among them, atomic layer deposition method can particularly provide a deposited film with good quality, the advantages are listed as follows: (1) controlling material formation at atomic level; (2) controlling film thickness in a more precise manner; (3) a larger production area; (4) providing excellent evenness (uniformity); (5) having excellent coating of three-dimensional (conformality); (6) non-porous structure; (7) low defect density; (8) low deposition temperature.

To sum up, the present invention provides a laminar structure of semiconductor with a protective layer below the substrate so as to reduce stress effect between the substrate and the epitaxial layer to avoid bending and cracking phenomenon, and further achieve improved yield and saved cost.

While the invention can be subject to various modifications and alternative forms, a specific example thereof has been shown in the drawings and is herein described in detail. It should be understood, however, that the invention is not to be limited to the particular form disclosed, but on the contrary, the invention is to cover all modifications, equivalents, and alternatives falling within the spirit and scope of the appended claims.

What is claimed is:

1. A laminar structure of semiconductor, comprising:
   a silicon substrate;
   an epitaxial layer arranged above the silicon substrate;
   a protective layer arranged below the silicon substrate, wherein coefficients of thermal expansion of the epitaxial layer and the protective layer are both either greater than or less than that of the silicon substrate;
   a first layer arranged on a lower surface of the silicon substrate and the protective layer is on the first layer, wherein a band gap of the first layer is greater than 3 eV; and
   a second layer arranged on an upper surface of the silicon substrate and the epitaxial layer is on the second layer, wherein a band gap of the second layer is greater than 3 eV; the silicon substrate is partially enclosed by the first layer and the second layer; and the first layer and the second layer both are a nitride layer; the upper surface, a side wall, and a portion of the lower surface of the silicon substrate is covered by the nitride layer;

and the side wall of the silicon substrate is covered by the first layer and the second layer; and the second layer extends along the lower surface from the side wall towards the inner portion of the silicon substrate.

2. The laminar structure of semiconductor as claimed in claim 1, wherein the epitaxial layer is a gallium nitride epitaxial layer or an aluminum nitride epitaxial layer.

3. The laminar structure of semiconductor as claimed in claim 1, wherein the protective layer is made of a metal silicide, a polysilicon, silicon dioxide or silicon nitride.

4. The laminar structure of semiconductor as claimed in claim 1, wherein the protective layer is made of a transition metal silicide.

5. The laminar structure of semiconductor as claimed in claim 4, wherein the metal silicide comprises NiSi, Ni2Si, NiSi2, tungsten silicide, titanium silicide, tantalum silicide or molybdenum silicide.

6. The laminar structure of semiconductor as claimed in claim 1, wherein the first layer is a nitride layer.

7. The laminar structure of semiconductor as claimed in claim 6, wherein the first layer is a silicon nitride layer, a gallium nitride layer or an aluminum gallium nitride layer.

8. The laminar structure of semiconductor as claimed in claim 1, wherein the second layer is a nitride layer.

9. The laminar structure of semiconductor as claimed in claim 8, wherein the second layer is a silicon nitride layer, a gallium nitride layer or an aluminum gallium nitride layer.

10. The laminar structure of semiconductor as claimed in claim 1, wherein the substrate is enclosed by the first layer and the second layer; and the first layer and the second layer both are a nitride layer.

11. The laminar structure of semiconductor as claimed in claim 10, wherein the nitride layer is a silicon nitride layer, a gallium nitride layer or an aluminum gallium nitride layer.

12. The laminar structure of semiconductor as claimed in claim 1, wherein the extending length of the second layer is about 1 centimeter.

\* \* \* \* \*